United States Patent
Gomez et al.

(10) Patent No.: US 6,827,546 B2
(45) Date of Patent: Dec. 7, 2004

(54) MODULAR FRAME FOR A WAFER FABRICATION SYSTEM

(75) Inventors: Rafael Gomez, Palo Alto, CA (US); Abdul Ghafar, Tracy, CA (US); Jonathan E. Borkowski, San Jose, CA (US); Kay Coghlan, Santa Cruz, CA (US); Andres Cannavo, San Francisco, CA (US); Rodney C. Ow, San Jose, CA (US)

(73) Assignee: Brooks-Pri Automation, Inc., Billerica, MA (US)

( * ) Notice: Subject to any disclaimer, the term of this patent is extended or adjusted under 35 U.S.C. 154(b) by 156 days.

(21) Appl. No.: 10/223,122

(22) Filed: Aug. 19, 2002

(65) Prior Publication Data

US 2004/0033125 A1 Feb. 19, 2004

(51) Int. Cl.⁷ .............................................. B65G 49/07
(52) U.S. Cl. ...................................................... 414/939
(58) Field of Search ........................ 414/939; 438/706, 438/711

(56) References Cited

U.S. PATENT DOCUMENTS

| | | | |
|---|---|---|---|
| 3,979,863 A | | 9/1976 | Hurley et al. ................... 52/92 |
| 4,043,485 A | | 8/1977 | Tippetts .................. 221/312 R |
| 4,790,921 A | * | 12/1988 | Bloomquist et al. ... 204/192.12 |
| 5,382,128 A | | 1/1995 | Takahashi et al. .......... 414/404 |
| 5,447,002 A | | 9/1995 | Wehrmann .................... 52/239 |
| 5,733,024 A | * | 3/1998 | Slocum et al. ........... 312/223.2 |
| 5,882,413 A | * | 3/1999 | Beaulieu et al. ............ 118/719 |
| 5,944,602 A | | 8/1999 | Grundy ....................... 454/187 |
| 5,983,420 A | | 11/1999 | Tilley .............................. 5/2.1 |
| 6,050,891 A | * | 4/2000 | Nering ........................ 454/187 |
| 6,111,189 A | | 8/2000 | Garvison et al. ........... 136/244 |
| 6,135,698 A | * | 10/2000 | Bonora et al. ......... 414/416.01 |
| 6,178,361 B1 | * | 1/2001 | George et al. .............. 700/213 |
| 6,237,783 B1 | * | 5/2001 | Sagawa ..................... 211/49.1 |
| 6,447,233 B1 | * | 9/2002 | Denker .................... 414/217.1 |
| 6,520,727 B1 | * | 2/2003 | Babbs et al. ................ 414/217 |
| 6,719,517 B2 | * | 4/2004 | Beaulieu et al. ............ 414/217 |

OTHER PUBLICATIONS

American Institute of Physics; Concepts and Requirements for Semiconductor Multiprocess Integration in Vacuum; Brian Hardegen, 1989.

* cited by examiner

Primary Examiner—Joe Dillon, Jr.
(74) Attorney, Agent, or Firm—Weingarten, Schurgin, Gagnebin & Lebovici LLP; Richard Pickreign

(57) ABSTRACT

A modular frame assembly for a wafer fabrication system comprising at least one base casting and at least one upstanding pod door opening casting. The at least one base casting and at least one upstanding pod door opening casting are self registering and allow frames for wafer fabrication systems of any normally desired configuration to be produced out of a small number of cast modules. More specifically, in a preferred embodiment, frames configured to mate with one to four commercially available loaders may be readily assembled out of the aluminum castings.

14 Claims, 9 Drawing Sheets

US 6,827,546 B2

MODULAR FRAME FOR A WAFER FABRICATION SYSTEM

CROSS REFERENCE TO RELATED APPLICATIONS

Not Applicable

STATEMENT REGARDING FEDERALLY SPONSORED RESEARCH OR DEVELOPMENT

Not Applicable

BACKGROUND OF THE INVENTION

The present invention relates to wafer fabrication systems used in the manufacture of integrated circuit devices and more specifically to a modular and configurable front end, buffer or frame employed within such systems.

Wafer fabrication systems are known that include a frame and a number of loaders or pod door openers (PDOs) within the system that are used for loading and unloading wafers for processing. A wafer fabrication system typically includes an input port for receiving wafers via a wafer cassette that may be mounted within a loader, a transport mechanism or robot for manipulating and moving a wafer to a processing station and a processing station for performing a desired fabrication process such as ion implantation, photolithography and metrology. Known wafer fabrication systems include a frame that is assembled based upon the specific number of loaders to be employed within the particular wafer processing system. The frame typically comprises a skeleton that includes steel frame members or components that are welded together to form the frame assembly.

Wafer fabrication system frames produced in the above manner have a number of drawbacks. First, large numbers of component parts need to be inventoried or produced to accommodate the different frame sizes. Second, welding of the frames is a time consuming labor intensive process and is inherently prone to large machine tolerances. Third, the lead time to produce a wafer fabrication system frame that employs numerous components is fairly great given the labor involved. Fourth, storage and transportation of welded frames is costly due to their large volumes. Additionally, there may be lead times associated with the fabrication of specific components of the frame if it is not designed to inventory all possible components.

For the above reason it would be desirable to be able to construct a frame for the front end of a wafer fabrication system that employs a small number of components. Such a frame should accommodate commercially available loaders, provide accurate registration among the component parts of the frame, be cost efficient to manufacture, and be assembled to accomodate one or more loaders.

BRIEF SUMMARY OF THE INVENTION

In accordance with the invention a modular frame for a configurable front end for a wafer fabrication system is disclosed. The configurable frame includes one or more predetermined base castings and one or more predetermined upstanding pod door opening (PDO) castings adapted to mate with corresponding base castings. Via use of the base and PDO castings, frames may be readily assembled from standard components without necessitating weldments or custom manufacture of components to accommodate a desired a number of loaders.

More specifically, in a preferred embodiment a modular frame is constructed from one or more self-referencing aluminum base castings and one or more upright self-referencing aluminum PDO castings.

The modular nature of the castings permit multiple configurations of wafer fabrication system frames to be constructed out of a limited number of base and PDO castings.

Other features, aspects and advantages of the invention will be apparent to those of ordinary skill in the art from the detailed description of the invention that follows.

BRIEF DESCRIPTION OF THE SEVERAL VIEWS OF THE DRAWING

The invention will be more fully understood by reference to the following detailed description of the invention taken in conjunction with the Drawing of which.

DETAILED DESCRIPTION OF THE INVENTION

In accordance with the present invention, a modular frame for a wafer fabrication system that can accommodate one or more loaders and wafer handling equipment is disclosed. The frame includes one or more base castings and a corresponding number of upstanding pod door opening (PDO) castings mounted to the respective base castings. Using a limited number of base castings and pod door opening castings a frame is assembled to accommodate any wafer fabrication system that is typically desired. The pod door opening castings are self registering with respect to the base castings to allow rapid assembly of a frame that is required to meet the particular needs of a customer.

Figure 1:
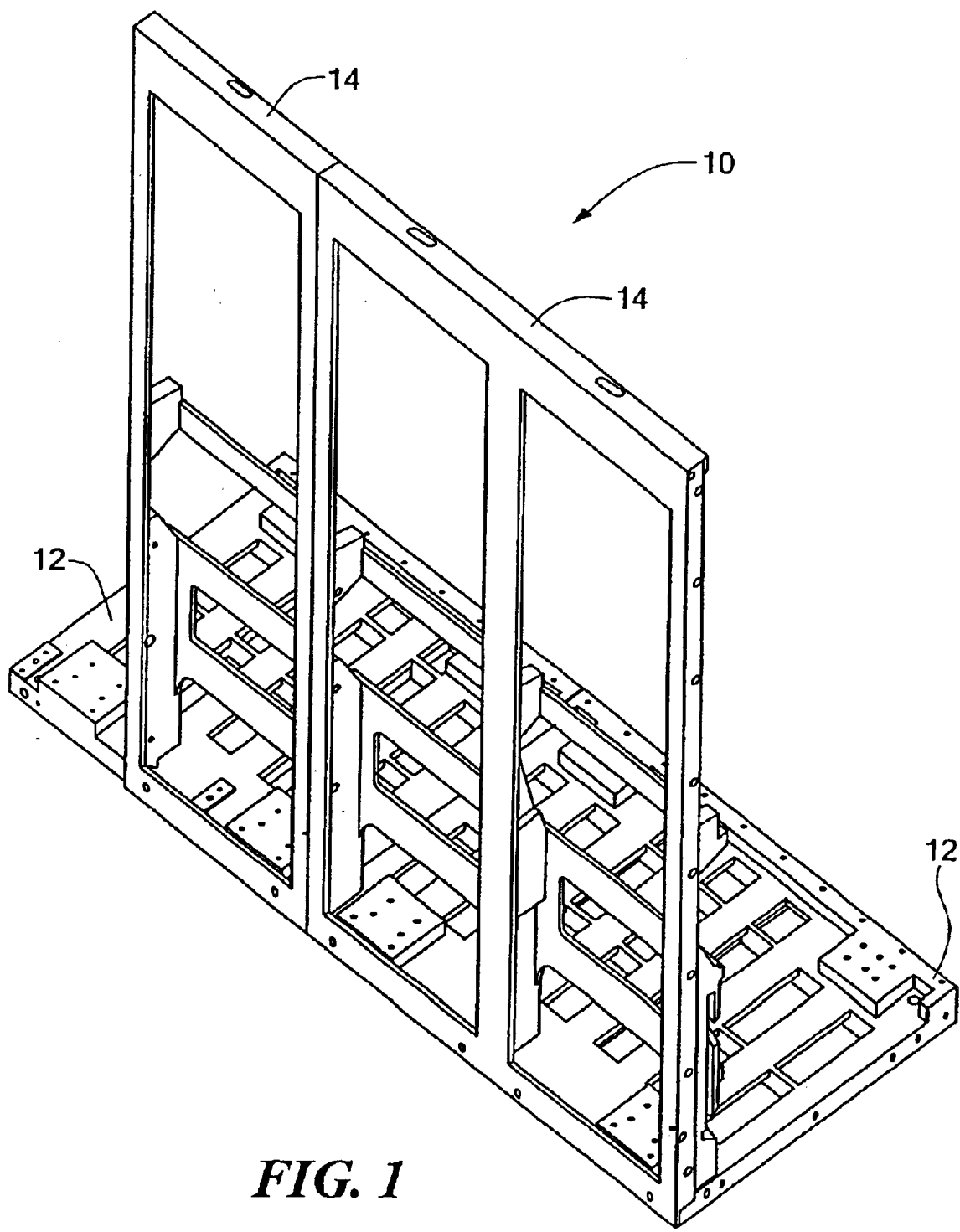
FIG. 1 is a perspective view of a modular frame assembly for a wafer fabrication system in accordance with the present invention casting.

Referring to FIG. 1, an exemplary modular frame 10 for a wafer fabrication system is shown. The frame 10 includes a plurality of base castings 12 and a plurality of PDO castings 14. The base castings 12 are fastened to adjacent base castings to form a base assembly. An upstanding PDO casting 14 is mounted to each of the base castings 12 and each PDO casting is pinned and fastened to adjacent PDO castings. The respective upstanding PDO castings 14 define a plane generally perpendicular to the plane of the respective base casting 12. Each PDO casting 14 is configured and adapted to mate with either one or more loaders. The number of loaders that can be accommodated by a given frame is defined by the number and type of castings employed.

Figure 2A:
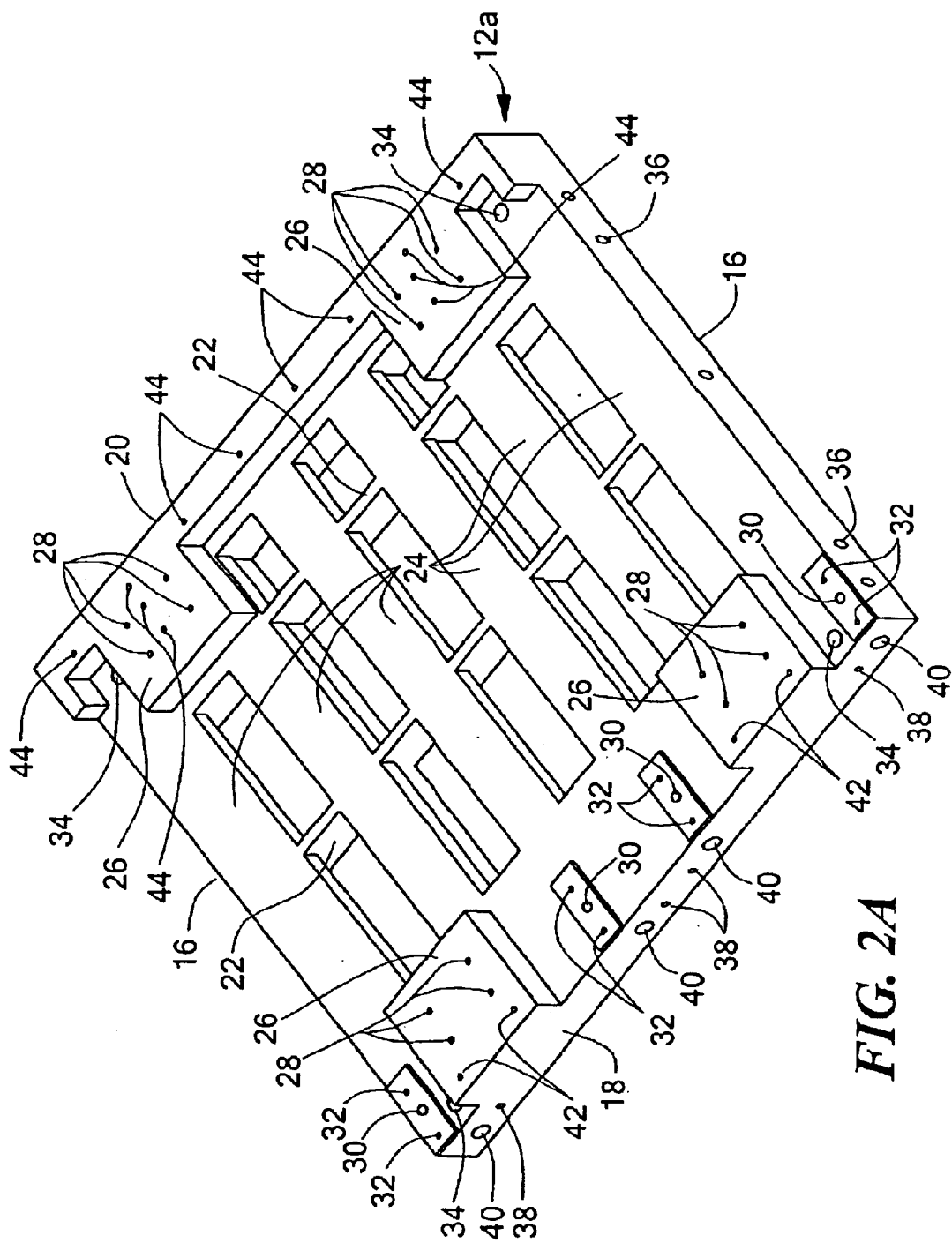
FIG. 2a is a perspective view of an extended single width base casting for use in the fabrication of a frame for a wafer fabrication system.
Figure 2B:
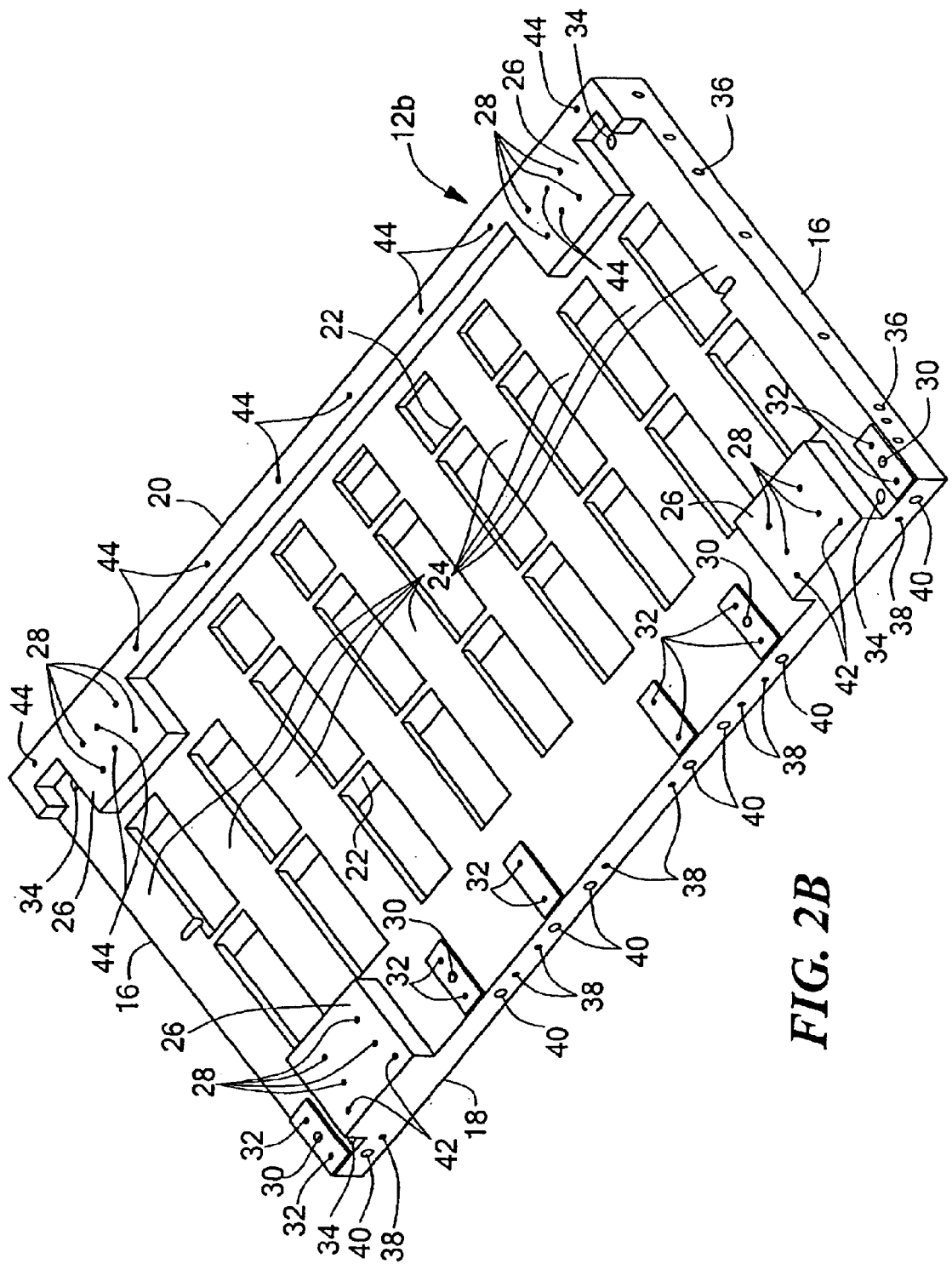
FIG. 2b is a perspective view of an extended double width base casting for use in the fabrication of a frame for a wafer fabrication system.
Figure 2C:
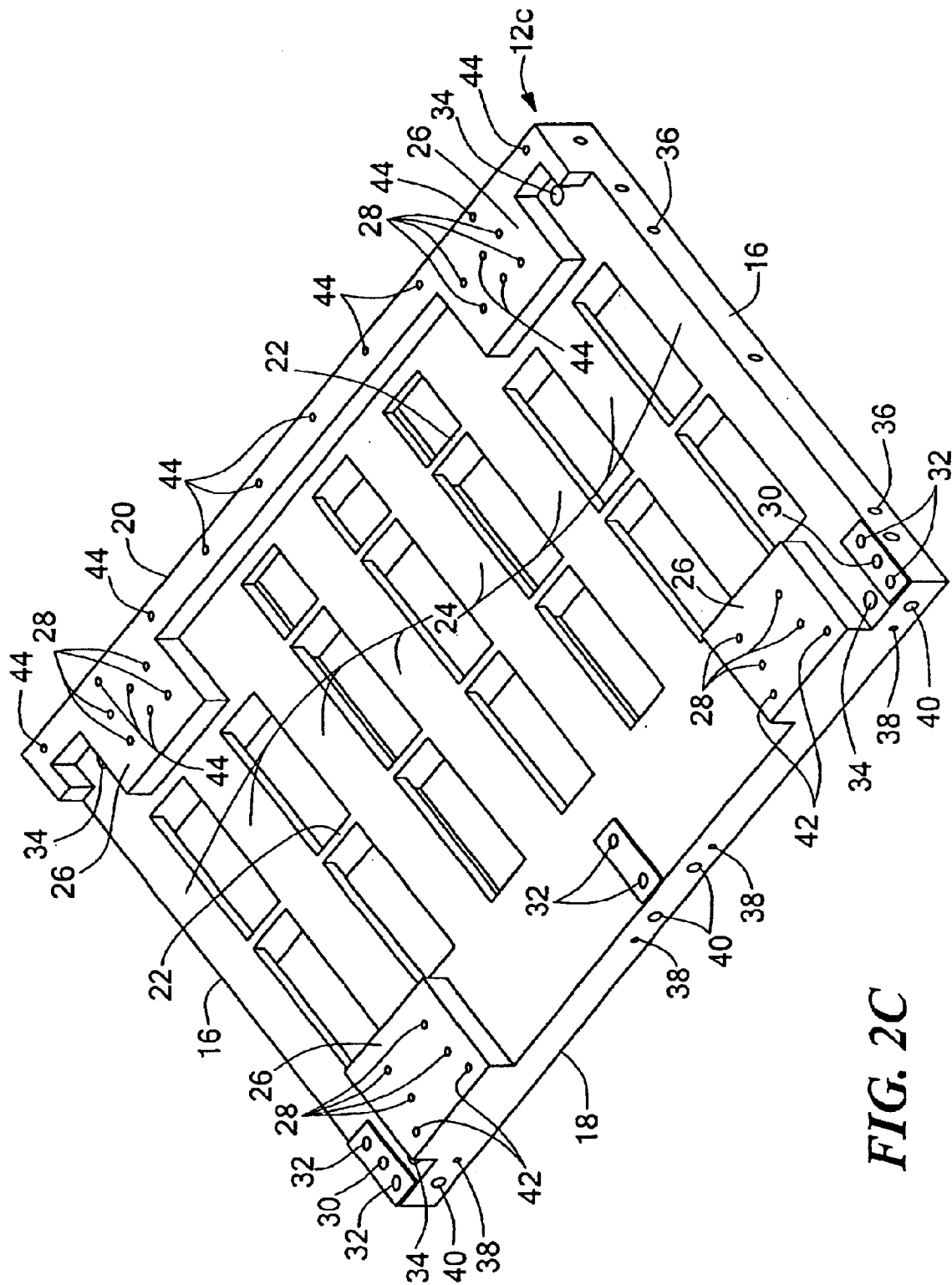
FIG. 2c is a perspective view of a double width base casting for use in the fabrication of a frame for a wafer fabrication system.

FIGS. 2a through 2c depict exemplary base castings 12 that may be employed as modules in the fabrication of the presently disclosed frames. More specifically, FIG. 2a depicts an extended single width base casting 12a that is sized and configured to accommodate a single width PDO casting. FIG. 2b depicts an extended double width base casting 12b that is sized to accommodate a double width PDO casting. FIG. 2c depicts a double width base casting 12c that is sized to accommodate a double width PDO casting.

Each of the base castings 12 has a generally similar configuration. More specifically, the base castings, 12a, 12b, 12c each include side members 16, a front member 18 and a rear member 20 integrally formed with the respective casting. Additionally, the base castings 12a, 12b, 12c each include longitudinal support members 22 and transverse slat members 24. Furthermore, the base castings 12a, 12b, 12c each include four pedestal sections 26 adjacent the front member 18 and rear member 20 of the respective base casting 12. The pedestal sections 26 are spaced a predetermined distance from the sides 16 of the respective casting 12 and provide a supporting structure for casters mounted on the underside of the casting. The underside of the pedestal section (not shown) is generally flat. Casters having a generally rectangular caster mounting plate may be bolted to the underside of the respective base castings 12 by screwing bolts into corresponding threaded openings 28 in the respective pedestal sections 26.

The base castings 12a, 12b, 12c each include openings 30 sized to receive alignment dowel pins. The dowel pins are inserted into the respective openings 30 and extend into corresponding openings in a corresponding PDO casting when the PDO casting is disposed in a mounting position with regard to the base casting as is subsequently discussed. The base castings 12a, 12b, 12c also include PDO casting mounting holes 32. The PDO mounting holes 32 are counterbored through holes that receive a mounting bolt from the underside of the respective castings. The mounting bolts extend through the respective PDO mounting holes 32 and engage cooperate threaded holes (not shown) within respective PDO castings.

Figure 2D:
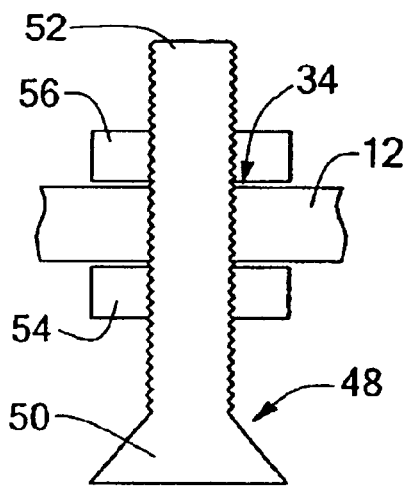
FIG. 2d is a cross-sectional view through a leveling foot depicting the mounting of the leveling foot to a base casting.

Furthermore, the base castings 12 include leveling foot threaded through holes 34 in the corners of the respective base castings 12. Referring to FIG. 2d, leveling feet 48 have a foot portion 50 and a threaded bolt portion 52. To mount a leveling foot 48 to a base casting 12 a first nut 54 is threaded onto the threaded bolt portion 52 of the leveling foot 48. The bolt portion 52 may then be threaded through a respective leveling foot threaded through hole 34 and a second nut 56 may optionally be screwed onto the threaded bolt portion 52 on the topside of the respective base casting 12 to capture the base casting 12 between the first and second nuts 54 and 56 (FIG. 2d). The first nut 54 may be tightened against the underside of the base casting 12 to secure the leveling foot 52 in position, even if the second nut 56 is not used.

The base castings 12a, 12b, 12c also include holes 36 in the sides of the sides 16 of the castings 12 to allow for the fastening of one base casting 12 to an adjacent base casting 12. The holes 36 may comprise through holes for bolts or alternatively, one casting may have through holes 36 for a bolt and the adjacent casting may have a threaded hole sized to receive a bolt that passes through the through holes 36 of the adjacent casting.

The base castings 12a, 12b and 12c further include threaded holes 38 in the front member 18 of the respective base casting 12 that are used for the mounting of the PDO castings 14 to the corresponding base castings 12. Additionally, the base castings 12 include clearance holes 40 that receive the ends of bolts that are employed to mount loaders to the respective PDO castings (FIG. 2c).

The base castings 12 also include threaded mounting holes 42 in the pedestal sections 26 of the respective base castings 12 that are employed for the attachment of a structural panel (not shown) to the casting and threaded mounting holes 44 in the rear section 20 of the respective castings 12 that are employed for the attachment of a rear structural panel (not shown) to the frame.

Figure 3A:
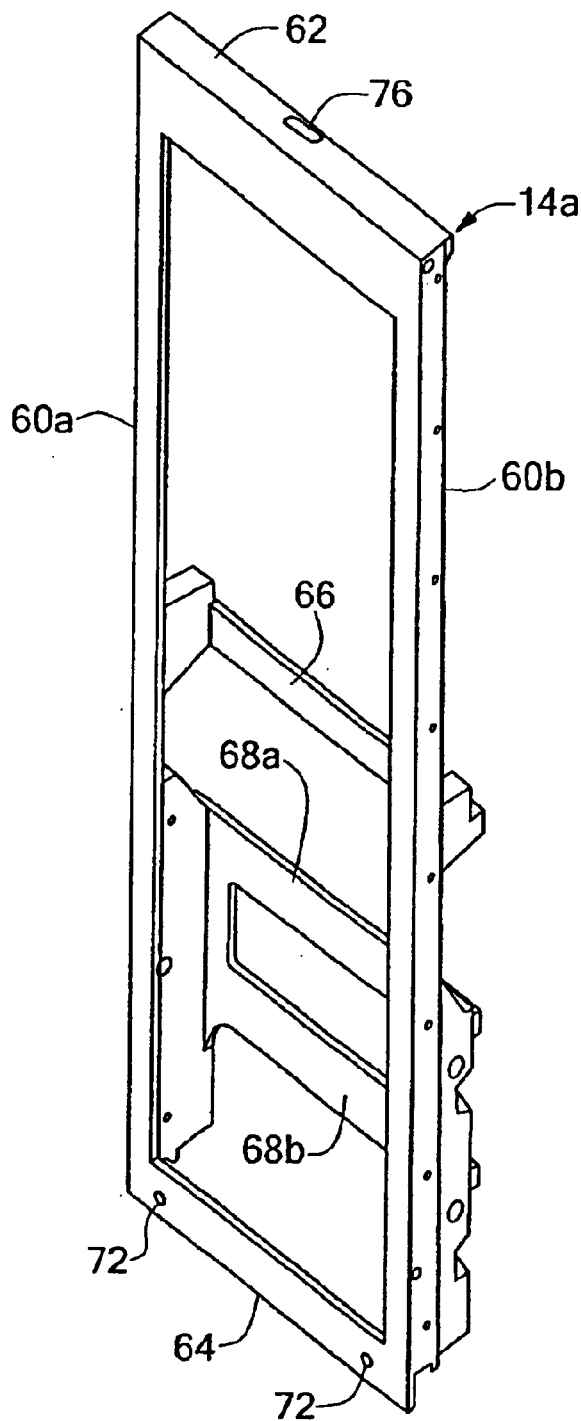
FIG. 3a is a perspective view of an single width pod door opening casting for use in the fabrication of a frame for a wafer fabrication system.
Figure 3B:
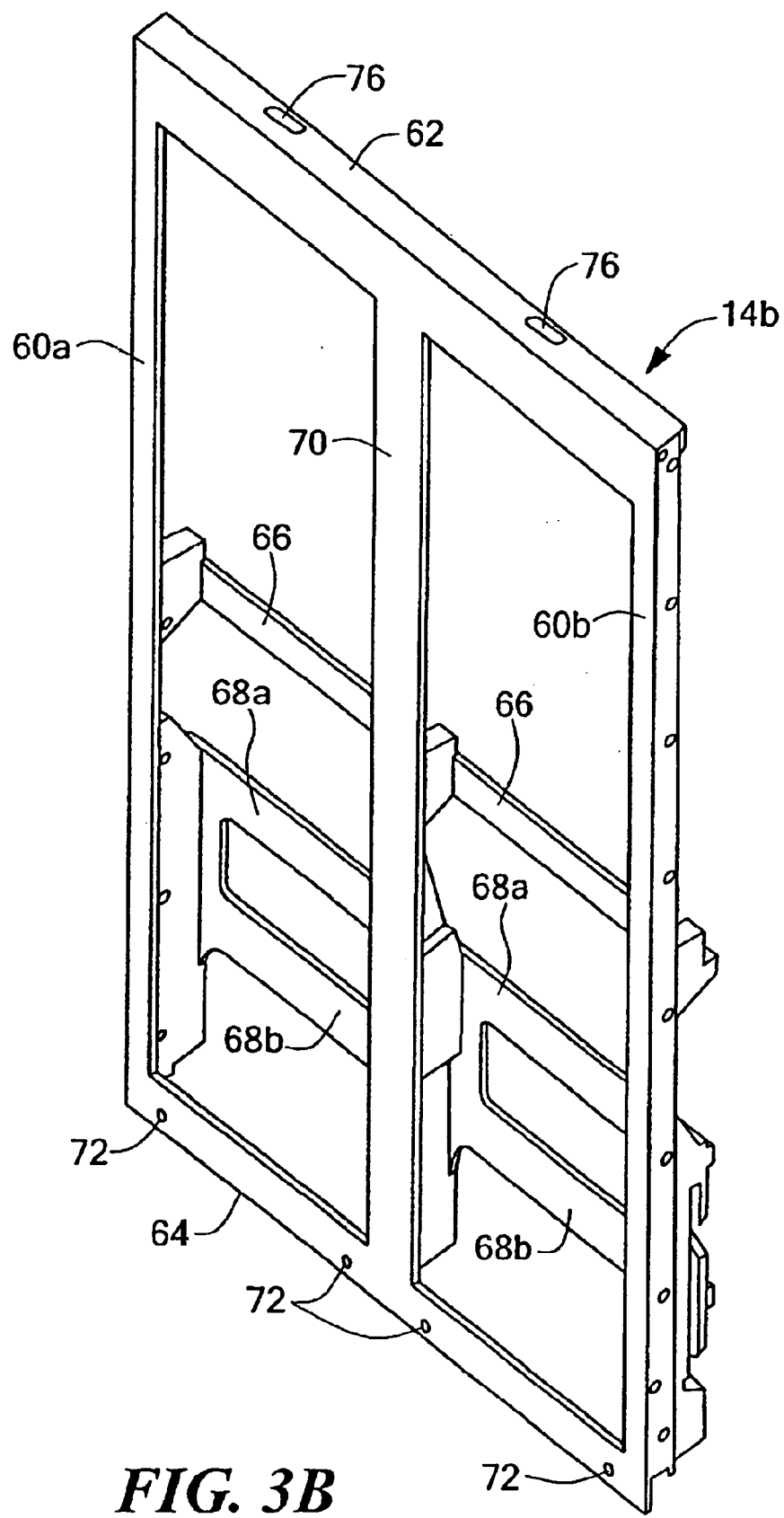
FIG. 3b is a perspective view of a double width pod door opening casting for use in the fabrication of a frame for a wafer fabrication system.

FIGS. 3a and 3b depict a single PDO casting 14a and a double PDO casting 14b respectively. The single and double PDO castings 14a and 14b respectively, are of a generally similar structure noting that the single PDO casting 14a is configured and adapted to mate with a single loader (not shown) and the double PDO casting 14b is configured and adapted to mate with two loaders (not shown). The PDO castings 14a, 14b include left and right side members 60a and 60b respectively, top and bottom members 62 and 64 respectively, upper mounting rails 66 and lower mounting rails 68a and 68b. The upper mounting rails 66 provide a mounting structure for a mid-partition table (not shown) that is typically mounted behind the respective upper mounting rail 66. The lower mounting rails 68a, 68b provide a mounting structure that accurately registers a vertically mounted linear track (not shown) or a robot (not shown) in a trackless system to a loader. More specifically, the lower mounting rails 68a, 68b may include pins that register with openings in the vertically mounted linear track or the robot to accurately position the track or robot to achieve precise alignment with the associated loader. Threaded openings in the lower mounting rails 68a, 68b are provided to allow for fastening of the vertically mounted linear track or the robot to the respective lower mounting rails. Alternatively, threaded holes may be provided in the structure of the vertically mounted linear track or the robot such devices may be fastened to the lower mounting rails via fasteners that extend through through-holes provided in the lower mounting rails 68a, 68b. Additionally, threaded holes and pin holes are provided in the sides of the PDO castings 14a, 14b for fastening adjacent PDO castings to each other. Finally, structural end panels (not shown) are mounted to the PDO castings using the exposed holes on the side of the PDO casting assembly.

The double width PDO casting 14b (FIG. 3b) further includes a vertical dividing member 70 that separates the left side pod door opening area from the right side pod door opening area. Counterbored through holes 72 are provided in the bottom member 64 of the PDO castings 14a, 14b. The counterbored through holes 72 in the single width PDO casting 14a coaxially align with corresponding openings 38 in the front member 18 of the extended single width base casting (FIG. 2a) when the single width PDO casting 14a is disposed in a mounting position with respect to the extended single width base casting 12a. It is noted that the extended single width base casting 12a is wider than the width of the single width PDO casting by approximately 12 inches in the illustrative embodiment to allow an electronic equipment rack to be mounted at one end of the casting. The single width PDO casting 14a may be mounted to the extended single width base casting 12a left justified using a first pair of threaded openings 38 in the front member 18 of the base casting 12a to allow for the mounting of an electronic equipment rack on the right side of the casting. Alternatively, the single width PDO casting 14a may be mounted to the extended single width base casting 12a right justified using a second pair of threaded openings 38 in the front member 18 of the base casting 12a to allow for the mounting of an electronic equipment rack on the left side of the casting.

Similarly the counterbored through holes 72 in the double width PDO casting 14b (FIG. 3b) coaxially align with corresponding openings 38 in the front member 18 of the extended double width base casting (FIG. 2b) when the double width PDO casting 14b (FIG. 3b) is disposed in a mounting position with respect to the extended double width base casting 12b. As in the case of the extended single width base casting 12a, the extended double width base casting 12b is wider than the width of the double width PDO casting 12b by approximately 12 inches in the illustrative embodiment to allow an electronic equipment rack to be mounted at one end of the casting. The double width PDO casting 14b (FIG. 3b) may be mounted to the extended double width base casting 12b (FIG. 2b) left justified using a first pair of threaded openings 38 in the front member 18 of the base casting 12b to allow for the mounting of an electronic equipment rack on the right side of the casting. Alternatively, the double width PDO casting 14b may be mounted to the extended double width base casting 12b right justified using a second pair of threaded openings 38 in the front member 18 of the base casting 12b to allow for the mounting of an electronic equipment rack on the left side of the casting.

Additionally, the double width PDO casting 14b may be mounted to the double width base casting 12c. When the double width PDO casting 14b is disposed in a mounting position with respect to the double width base casting 12c, the counterbored through holes 72 in the double width PDO casting 14b (FIG. 3b) coaxially align with corresponding threaded openings 38 in the front member 18 of the double width base casting (FIG. 2c). The base castings 12a, 12b, 12c and the PDO castings 14a, 14b may be fabricated as aluminum castings or castings of any other suitable material. Utilizing a limited number of castings, frame assemblies may be fabricated to accommodate any desired number of loaders.

The PDO castings 14 include one or more wire channels 76 comprising elongated openings that extend vertically through the top member 62 of the respective PDO casting 14 (FIGS. 3a, 3b). The wire channels 76 provide passageways within the respective PDO casting 14 to facilitate the routing of system wiring that may be required.

Figure 4:
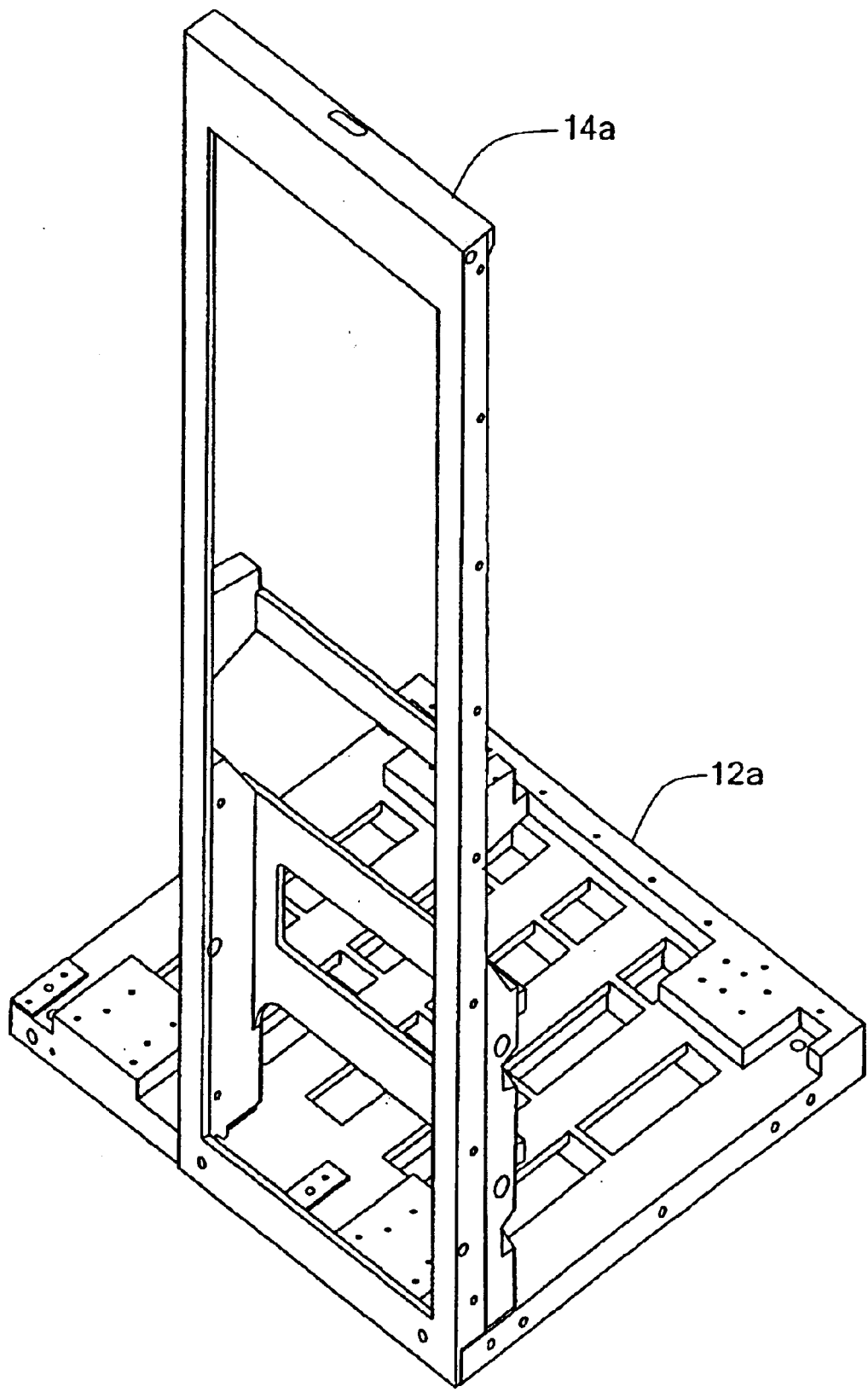
FIG. 4 is a perspective view of a frame assembly for a wafer fabrication system configured and adapted to mate with a single loader.
Figure 5:
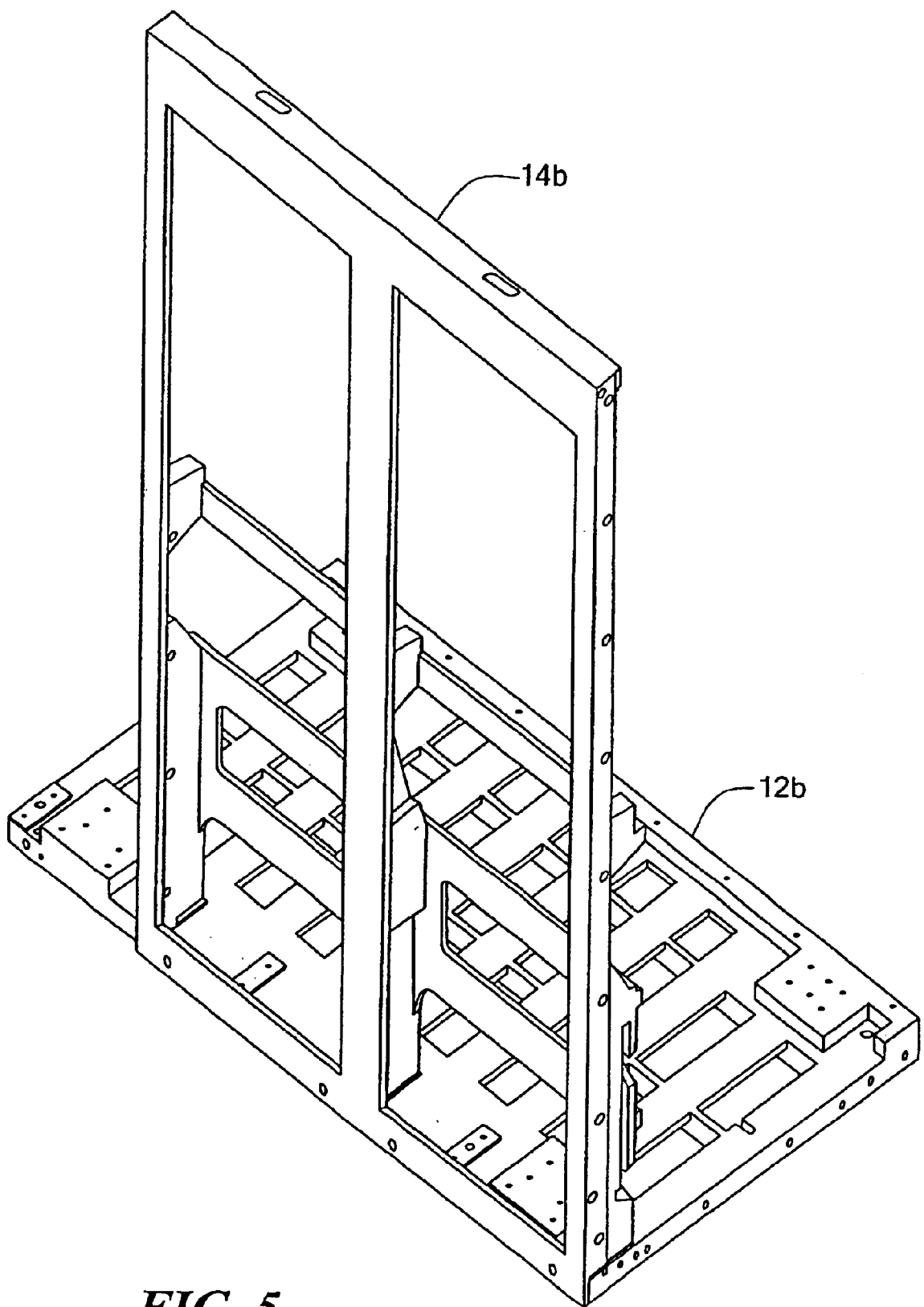
FIG. 5 is a perspective view of a frame assembly for a wafer fabrication system configured and adapted to mate with two loaders.
Figure 6:
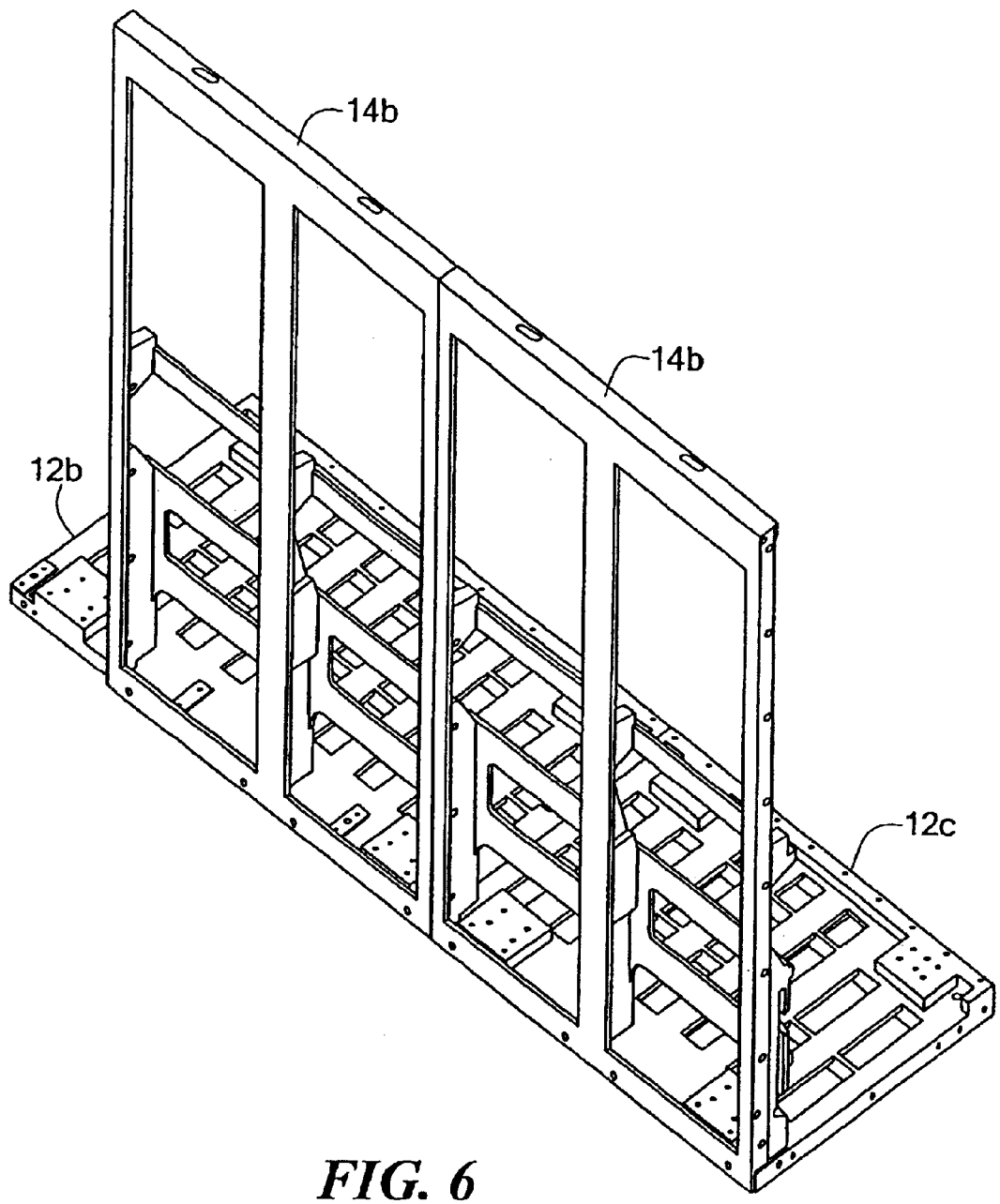
FIG. 6 is a perspective view of a frame assembly for a wafer fabrication system configured and adapted to mate with four loaders.

FIG. 4 depicts a frame assembly for a single loader that comprises a single width PDO casting 14a and an extended single width base casting 12a. FIG. 5 depicts a frame assembly configured and adapted to receive two loaders. The frame assembly comprises one double width PDO casting 14b and one extended double width base casting 12b. FIG. 1, as previously noted, depicts a frame assembly configured and adapted to receive three loaders. The frame assembly depicted in FIG. 1 comprises an extended single width base casting 12a (FIG. 2a), a double width base casting 12c (FIG. 2c), a single width PDO casting 14a (FIG. 3a) and a double width PDO casting 14b (FIG. 3b). FIG. 6 depicts a frame assembly configured and adapted to receive four pod units. The frame assembly depicted in FIG. 6 comprises an extended double width base casting 12b (FIG. 2b), a double width base casting 12c (FIG. 2c) and two double width PDO castings 14b (FIG. 3b).

It will be appreciated by those of ordinary skill in the art that modifications to and variations of the above-described frame assemblies for a wafer fabrication system may be made without departing from the inventive concepts disclosed herein. Accordingly, the invention should not be viewed as limited except as by the scope and spirit of the appended claims.

What is claimed is:

1. In a wafer fabrication system, a modular frame comprising:

a generally rectangular integrally formed base casting having a predetermined depth and width, said base casting having a front member, a rear member, and left and right side members, said base casting having a top surface generally defining a first plane;

a generally rectangular integrally formed pod door opening casting having a predetermined width and height, said pod door opening casting including a bottom member, a top member, left and right side members and at least one cross member extending from said left side member to said right side member, said pod door opening casting including at least one opening between said left and right side members, said top member and said bottom member sized to receive a loader, said pod door opening casting generally defining a second plane;

said bottom member of said door opening casting being mounted to said front member of said base casting such that said second plane is perpendicular to said first plane;

said base casting and said pod door opening casting each have at least one dowel pin receiving opening, said at least one dowel pin receiving opening being in opposed coaxial relation when said pod door opening casting is disposed in a mounting position with respect to said base casting; and a dowel pin having first and second ends, said first and second ends disposed in respective openings of said base casting and said pod door opening casting to align said pod door opening casting with respect to said base casting in said mounting position.

2. The modular frame of claim 1 wherein said integrally formed pod door opening casting further includes a vertical dividing member mid-way between said left and right side members, and said integrally formed pod door opening casting includes first and second openings sized to mate with respective loaders, wherein said first opening is defined by said left side member, maid dividing member, maid top member and said bottom member and said second opening is defined by said right side member, said dividing member, maid top member and said bottom member of said pod door opening casting.

3. The modular frame of claim 1 wherein said base casting and said pod door opening casting comprise aluminum castings.

4. In a wafer fabrication system, a modular frame comprising:

a plurality of integrally formed base castings having a front member portion, a rear member portion and left and right side member portions, each one of said plurality of base castings having a respective depth and width;

a plurality of integrally formed generally rectangular pod door opening castings corresponding in number to the number of base castings, each pod door opening casting having a bottom member portion, a top member portion and left and right side member portions;

a first plurality of fasteners extending through openings in the front member of said base castings and engaging respective pod door opening castings to mount each pod door opening casting to the corresponding base casting in a plane generally perpendicular to the respective base casting;

each of said base castings and said pod door opening castings have at least one dowel pin receiving opening, said at least one dowel pin receiving opening being in opposed coaxial relation when said pod door opening castings are disposed in a mounting position with respect to said base castings; and a plurality of dowel pins each having first and second ends, said first and second ends disposed in respective openings of said base castings and said pod door opening castings to align said pod door opening castings with respect to said base castings in said mounting position;

at least one second fastener mechanically coupling one side member of one of said plurality of base castings in abutting relation with a side member of another one of said plurality of base castings; and at least one third fastener mechanically coupling a side member portion of one of said plurality of pod door opening castings in abutting relation with a side member portion of another one of said plurality of pod door opening castings.

5. The modular frame of claim 4 wherein said base castings and said pod door opening castings comprise aluminum castings.

6. The modular frame of claim 4 wherein one of said plurality of base castings has a width greater than the width of another one of said plurality of base castings.

7. The modular frame of claim 4 wherein said plurality of base castings includes first and second base castings and said plurality of pod door opening castings includes first and second pod door opening castings.

8. The modular frame of claim 7 wherein said first pod door opening casting includes a single opening sized to mate with a first loader and said second pod door opening casting includes two openings sized to mate with second and third loaders.

9. The modular frame of claim 8 wherein the width of said second pod door opening casting is generally the same as the width of said second base casting.

10. The modular frame of claim 7 wherein said first and second pod door opening castings each have two openings sized to mate with two loaders.

11. The modular frame of claim 10 wherein the width of said second pod door opening casting is generally the same as the width of said second base casting.

12. The modular frame of claim 7 wherein the width of said first and second pod door opening castings are generally the same as the width of the corresponding first and second base castings.

13. The modular frame of claim 1 wherein at least one said cross-members includes registration means for accurately aligning a vertically mounted linear track to the respective pod door opening casting.

14. The modular frame of claim 1 wherein at least one said cross-member includes registration means for accurately aligning a robot to the respective pod door opening casting.

* * * * *

UNITED STATES PATENT AND TRADEMARK OFFICE
CERTIFICATE OF CORRECTION

PATENT NO. : 6,827,546 B2
DATED : December 7, 2004
INVENTOR(S) : Rafael Gomez et al.

It is certified that error appears in the above-identified patent and that said Letters Patent is hereby corrected as shown below:

Column 6,
Line 49, "maid dividing member, maid top" should read -- said dividing member, said top --; and
Line 52, "maid top" should read -- said top --.

Signed and Sealed this

Twenty-fifth Day of October, 2005

JON W. DUDAS
*Director of the United States Patent and Trademark Office*